(12) United States Patent
Oh

(10) Patent No.: US 7,385,858 B2
(45) Date of Patent: Jun. 10, 2008

(54) SEMICONDUCTOR INTEGRATED CIRCUIT HAVING LOW POWER CONSUMPTION WITH SELF-REFRESH

(75) Inventor: HakJune Oh, Kanata (CA)

(73) Assignee: MOSAID Technologies Incorporated, Kanata, Ontario (CA)

( * ) Notice: Subject to any disclaimer, the term of this patent is extended or adjusted under 35 U.S.C. 154(b) by 41 days.

(21) Appl. No.: 11/289,428

(22) Filed: Nov. 30, 2005

(65) Prior Publication Data
US 2007/0121406 A1 May 31, 2007

(51) Int. Cl.
*G11C 7/10* (2006.01)
*G11C 7/00* (2006.01)
*G11C 8/00* (2006.01)

(52) U.S. Cl. .......... 365/189.08; 365/191; 365/196; 365/222; 365/230.03

(58) Field of Classification Search .......... 365/222, 365/191, 196, 189.08, 230.03
See application file for complete search history.

(56) References Cited

U.S. PATENT DOCUMENTS

| | | | |
|---|---|---|---|
| 5,021,688 A | | 6/1991 | Leforestier et al. |
| 5,889,725 A | | 3/1999 | Aikawa et al. |
| 5,970,018 A | * | 10/1999 | Iwata et al. ............. 365/230.06 |
| 6,021,077 A | * | 2/2000 | Nakaoka ..................... 365/221 |
| 6,191,997 B1 | | 2/2001 | Son et al. |
| 6,256,252 B1 | * | 7/2001 | Arimoto ..................... 365/227 |
| 6,292,413 B1 | * | 9/2001 | Kato et al. .................. 365/200 |
| 6,437,410 B1 | * | 8/2002 | Dietrich et al. ............. 257/390 |
| 6,608,794 B2 | * | 8/2003 | Yoshioka ............... 365/230.03 |
| 6,944,081 B2 | * | 9/2005 | Takahashi et al. .......... 365/222 |
| 2001/0045579 A1 | * | 11/2001 | Ooishi et al. ............... 257/222 |
| 2002/0053924 A1 | * | 5/2002 | Sakata et al. ................. 326/34 |
| 2002/0105845 A1 | * | 8/2002 | Hidaka ....................... 365/222 |
| 2004/0120202 A1 | | 6/2004 | Terzioglu et al. |
| 2004/0196728 A1 | | 10/2004 | Matsuzaki |

* cited by examiner

Primary Examiner—Ly Duy Pham
(74) Attorney, Agent, or Firm—Shin Hung; Borden Ladner Gervais LLP

(57) ABSTRACT

A dynamic random access memory has logically identical circuits for providing the same logical control signals. Each set of control signals can have different electrical parameters. One circuit can be optimized for high speed performance, while another circuit can be optimized for low power consumption. The logically identical circuits can include wordline address predecoder circuits, where a high speed predecoder circuit is enabled during a normal operating mode and a slower low power predecoder circuit is enabled for self-refresh operations. During self-refresh operations, the high speed circuit can be decoupled from the power supply to minimize its current leakage.

9 Claims, 8 Drawing Sheets

SEMICONDUCTOR INTEGRATED CIRCUIT HAVING LOW POWER CONSUMPTION WITH SELF-REFRESH

FIELD OF THE INVENTION

The present invention generally relates to dynamic random access memories (DRAMs). In particular, the present invention relates to DRAM self-refresh circuits.

BACKGROUND OF THE INVENTION

As transistor semiconductor fabrication technology approaches the nanometer level, several primary advantages are realized by resulting circuits and systems that use them. Higher integration packs more features and functions into a given area of silicon than older fabrication technology, resulting in smaller and more easily portable devices. With higher integration, a larger number of chips per silicon wafer can be fabricated, effectively reducing the cost per chip. Smaller transistors switch faster due to a lowered threshold voltage, providing faster operating speed for systems.

An example of a semiconductor device that takes advantage of smaller dimensioned transistors is dynamic random access memory, simply referred to with the acronym DRAM from this point forward. Those of skill in the art understand that DRAM is most widely employed in computer systems due to its high density and speed. While there are different types of DRAM memory available to accommodate specific standards, such as RDRAM, SDRAM, DDR-SDRAM for example, their underlying core is still DRAM.

The DRAM memory cell is based on charge storage for differentiating between a stored logic "1" and logic "0". Unfortunately, this charge will leak or dissipate after a relatively short period of time, hence requiring periodic refreshing to maintain the stored logic level. DRAM refresh is well known in the art, as are the circuits required to execute refresh operations. A simplified description of a refresh operation is now discussed with reference to the prior art DRAM system shown in FIG. 1.

The prior art DRAM of FIG. 1 includes a memory cell array 100, pitch-limited peripheral circuits, data path circuits, addressing circuits and refresh control circuits. The DRAM system of FIG. 1 has been simplified, however those skilled in the art will understand that DRAM systems will include other circuits to enable further functions.

The memory cell array 100 includes wordlines and bitlines coupled to memory cells. The pitch-limited peripheral circuits include row decoders 102 for driving the wordlines, and sense amplifier and bitline access circuits 104 for transferring data in to and out of the memory cells. Pitch-limited circuits are densely packed to correspond with the size of the memory cell array 100.

It is noted at nodes coupled or connected together can include links that may or may not include intervening circuits.

Addressing circuits can include a row address predecoder 106 for generating a predecoded row address in response to a row address R_ADDR[n], a column address decoders 108 for activating bitline access devices in response to a column address C_ADDR[m], and address buffers 110 for generating R_ADDR[n] and C_ADDR[m] in response to external addresses A0 to An. The data path circuits include data I/O circuits 112 for coupling the data between the sense amplifiers in block 104 to data input/output buffers (not shown). It is noted that variable n and m above are equal to 0 or integer values greater than 0.

The refresh control circuits include a command controller 114, an internal row address counter 116 and a self-refresh circuit 118. Such refresh control circuits are well known in the art, and the system shown in FIG. 1 can include additional circuit blocks to execute additional operations. Command controller 114 responds to clock signal CLK and receives several system level signals, such as CKE, WT, RD and REF, which are decoded to initiate various operations within the DRAM system through signal COMMAND. Three example operations used to illustrate the operation of the DRAM system will include a read operation, an auto-refresh operation and a self-refresh operation.

A DRAM read operation should be well known to those skilled in the art. In FIG. 1, a read operation is initiated when command controller 114 receives a predefined combination of signals CKE, WT, RD, REF to signal a read operation, and address buffer 110 receives a specific set of address signals A0 to An. Address buffer 110 generates a set of row addresses R_ADDR[n] and a set of column addresses C_ADDR[m]. Row address predecoder 106 generates predecoded row address signals from R_ADDR[n], which are then used by row decoders 102 to drive at least one wordline in memory cell array 100. All the memory cells connected to the driven wordline will couple their stored charge to respective bitlines. In other words, each bitline in memory cell array 100 will carry data, which is subsequently sensed and latched by corresponding bitline sense amplifiers in block 104. Depending upon the configuration, column address decoder 108 will select at least one bitline access device in block 104 corresponding to C_ADDR[m], to couple that bitline sense amplifier to data I/O circuit block 112. The read operation does not involve the refresh control circuits.

The main difference between an auto-refresh and a self-refresh operation is the time they are executed. Auto-refresh, also known as CAS-Before-RAS refresh and RAS-Only refresh, is executed during normal operation of the DRAM system, while a self-refresh operation is executed during a sleep mode of the DRAM system. It is well known that a sleep mode is used to power down selected circuits of the DRAM system in order to reduce power consumption, however DRAM cells in memory cell array 100 must be refreshed during sleep mode to retain the stored data.

An auto-refresh operation is executed during normal operation of the DRAM system when a refresh command is received via the external signals received by command controller 114. The command controller 114 then provides a control signal REFR to increment or decrement internal row address counter 116, and to enable latching by the address buffers 110. Internal row address counter 116 provides a refresh address REF_ADDR[p] which is latched by address buffers 110. It is noted that variable p is equal to 0 or an integer value greater than 0. Address buffers 110 generates a row address R_ADDR[n], which is decoded by row address predecoder 106 and row decoders 102 to drive at least one wordline. Each bitline sense amplifier then restores the charge of the accessed memory cells through its inherent amplifying operation. Since the auto-refresh operation is executed during normal operation with priority over other operations, it is executed quickly to allow other operations to resume.

The self-refresh circuit 118 includes an internal oscillator (not shown). The DRAM system enters sleep mode (or "self-refresh mode") through the command controller 114 to initiate the oscillator of the self-refresh circuit 118. Self-refresh circuit 118 provides a sleep signal SLEEP for internal row address counter 116. In accordance with the commands for self-refresh entry and exit, a signal OSC_OUT is periodically generated in the self-refresh mode. The generated signal OSC_OUT is provided to internal row address counter 116 and address buffers 110. In response to OSC_OUT, address buffers 110 latches REF_ADDR[p] generated by internal row address counter 116, and provides row address R_ADDR[n]. As in the previously described auto-refresh case, a wordline is driven via row address predecoder 106 and row decoders 102 to refresh the memory cells in memory cell array 100.

Implementation of the DRAM system of FIG. 1 in state of the art nanometer fabrication technology will inherently increase the speed performance of the system. In particular the transistors, especially the row address predecoder 106 and row decoders 102, can be optimized to minimize propagation delay of the row address R_ADDR[n] through them. However, a significant disadvantage of minimally dimensioned high-speed transistors is leakage current through the transistor, which increases the overall power consumption of the DRAM system. Current leakage problems with nanometer scale technology has been well documented by the semiconductor industry. Therefore, the high-speed operation is obtained at the expense of power consumption.

FIGS. 2 and 3 are circuit schematics presented to illustrate the source of current leakage in nanometer technology transistors. FIG. 2 is a simple logic gate circuit consisting of a 2-input NAND gate 200 having an output connected to an input of an inverter 202. By example, this circuit can be one of several circuits in the row address predecoder 106 of FIG. 1. NAND gate 200 receives two row addresses, R_ADDR[h] and R_ADDR[i], and generates predecoded row address PDR_ADDR[k] through inverter 202. It is noted that variables h, i and k are equal to 0 or integer values greater than 0. Both NAND gate 200 and inverter 202 are implemented with CMOS transistors, and preferably minimally sized to maximize speed. While not explicitly shown, the two logic gates are connected to the VDD and VSS power supplies. Current leakage can occur in all the transistors of each logic gate, as will be shown in FIG. 3.

FIG. 3 is a transistor schematic of inverter 202 shown in FIG. 2. Inverter 202 is a standard complementary CMOS inverter consisting of p-channel transistor 300 and n-channel transistor 302 connected in series between VDD and VSS. The CMOS transistor implementation of NAND gate 200 is well known in the art and hence not shown. When implemented in nanometer technology, transistors 300 and 302 can leak current ($I_{leak1}$) from VDD to VSS even if input signal IN is held at the logic "0" or logic "1" states. Furthermore, current can leak from VDD through the thin gate oxides of transistors 300 and 302 ($I_{leak2}$), allowing current to flow through to a drain/source terminal of a preceding transistor. For example, if the gate of transistor 300 is driven to VSS by a preceding circuit, current can leak from VDD through its gate oxide directly to VSS.

Therefore, self-refresh operations for DRAM systems can consume a significant amount of power, which is undesirable for portable computing applications. In portable computing applications where battery life is finite, the sleep mode can be frequently used and for extended periods of time in an effort to extend battery life.

It is, therefore, desirable to provide a low power self-refresh scheme for DRAM systems.

SUMMARY OF THE INVENTION

It is an object of the present invention to obviate or mitigate at least one disadvantage of previous self-refresh systems for DRAM memory.

In a first aspect, the present invention provides a mode dependent logic circuit for use in a dynamic random access memory. The mode dependent logic circuit can include a first circuit for generating a first signal in response to a predetermined logic state of a first input signal, in a first operating mode and, a second circuit logically identical to the first circuit for generating a second signal in response to the predetermined logic state of a second input signal, in a second operating mode.

According to aspects of the present embodiment the second circuit includes transistors having a higher threshold voltage than transistors of the first circuit. The first circuit includes a power switch circuit for selectively disconnecting the transistors of the first circuit from VDD or VSS in the second operating mode. The second circuit includes a power switch circuit for selectively disconnecting the transistors of the first circuit from VDD and VSS in a deep power down mode. The mode dependent logic circuit can further include a selector circuit for receiving the first signal and the second signal, the selector circuit passing the first signal in the first operating mode and passing the second signal in the second operating mode. The mode dependent logic circuit can further include at least two first signal lines for providing the first input signal, and at least two second signal lines for providing the second input signal, the first and the second signal lines being interleaved with each other.

In yet another aspect, the mode dependent logic circuit further includes a first drive circuit coupled to the at least two first signal lines, and a second drive circuit coupled to the at least two second signal lines, the second drive circuit driving the at least two second signal lines to one of VDD and VSS in the first operating mode.

In a second aspect, the present invention provides a dynamic random access memory (DRAM) having a self-refresh operation. The DRAM can include a predecoder circuit for providing a predecoded address in response to a logical row address in a normal operation, a low power predecoder circuit for providing the predecoded address in response to the logical row address in the self-refresh operation, and a row decoder for receiving the predecoded address and driving at least one wordline corresponding to the predecoded address. The DRAM can further include a power switch circuit for selectively decoupling the predecoder circuit from VDD or VSS in the self-refresh operation. The DRAM can further include a multiplexor circuit for passing the predecoded address from the predecoder circuit in the normal operation and for passing the predecoded address from the low power predecoder circuit in the self-refresh operation. The low power predecoder circuit can include transistors having a higher threshold voltage than transistors of the predecoder circuit. The low power predecoder circuit and the predecoder circuit can have identical logic circuit configurations.

In yet a further embodiment, the DRAM can further include a first address bus for providing a first row address to the predecoder circuit, and a second address bus for providing a second row address to the low power predecoder circuit. The signal lines of the first address bus and the second address bus are interleaved. The DRAM can further include a high speed address buffer for driving the first address bus in the normal operation, and a low power address buffer for driving the second address bus in the self-refresh operation, the low power address buffer driving the second address bus to one of VDD and VSS in the normal operation.

In a third aspect, the present invention provides a method for operating a dynamic random access memory (DRAM) in a self-refresh operation. The method includes a) disabling a high speed predecoder circuit; b) enabling a low power predecoder circuit, the low power predecoder circuit being logically identical to the high speed predecoder circuit; and, c) providing a refresh address for the low power predecoder circuit.

According to embodiments of the present aspect, the method can further include the step of decoupling the high speed predecoder circuit from VDD or VSS, and can further include selectively providing a predecoded row address from the low power predecoder circuit. The step of providing the refresh address includes enabling a low power address buffer to latch the refresh address provided by a row address counter, and disabling a high speed address buffer. The high speed address buffer can be decoupled from VDD and VSS.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides logically identical circuits for providing the same logical control signals, where each set of control signals can have different electrical parameters. One circuit can be optimized for high speed performance, while another circuit can be optimized for low power consumption. The logically identical circuits can include wordline address predecoder circuits for a DRAM, where a high speed predecoder circuit is enabled during a normal operating mode and a slower low power predecoder circuit is enabled for self-refresh operations. During self-refresh operations, the high speed circuit can be decoupled from the power supply to minimize its current leakage.

The embodiments of the present invention are now described in the context of DRAM, and in particular, DRAM self-refresh row addressing circuits.

As previously described, read, write and auto-refresh operations are executed at high speed with tight timing margins. Self-refresh during sleep or similar lower power modes on the other hand, can be executed at slower speeds. More specifically, the wordline activation timing constraints can be relaxed since high speed operation is not required. Therefore, portions of the row addressing path can be decoded with logic circuits optimized for lower speed operation and low power consumption. Since such circuits cannot operate at high speed for read/write and auto-refresh operations, the low power consumption circuit is added to the DRAM system. Although additional silicon area will be consumed, the power saving advantages of having a dedicated low power consumption circuit path will outweigh the added silicon area cost. Accordingly, the electrical parameters of the signals can include timing. Also, the voltages such as internal VDD can be adjusted to lower level voltages.

A known leakage current reduction method is to increase the threshold voltage of the transistors. As should be known to persons skilled in the art, threshold voltage can be adjusted during fabrication by tailoring gate oxide thickness, implant concentrations and transistor dimensions, for example. For the purposes of the present invention, any threshold voltage adjustment technique can be used.

Figure 4:
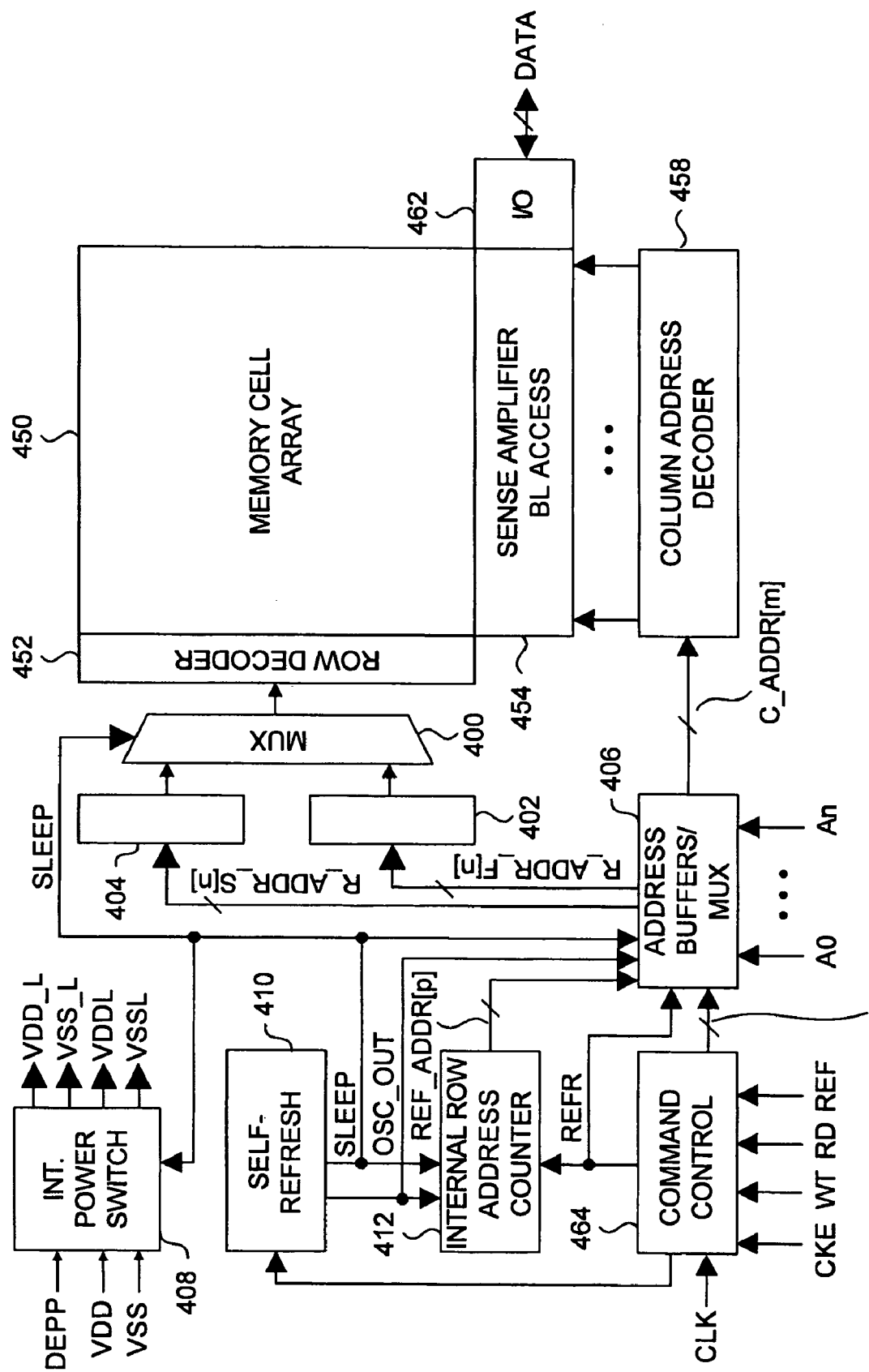
FIG. 4 is a block diagram of a DRAM system with low power self-refresh circuits according to an embodiment of the present invention.

FIG. 4 is a block diagram of a DRAM system according to an embodiment of the present invention. The presently shown system is similar to the system shown in FIG. 1, and includes additional features to reduce power consumption during a self-refresh operation.

Figure 1:
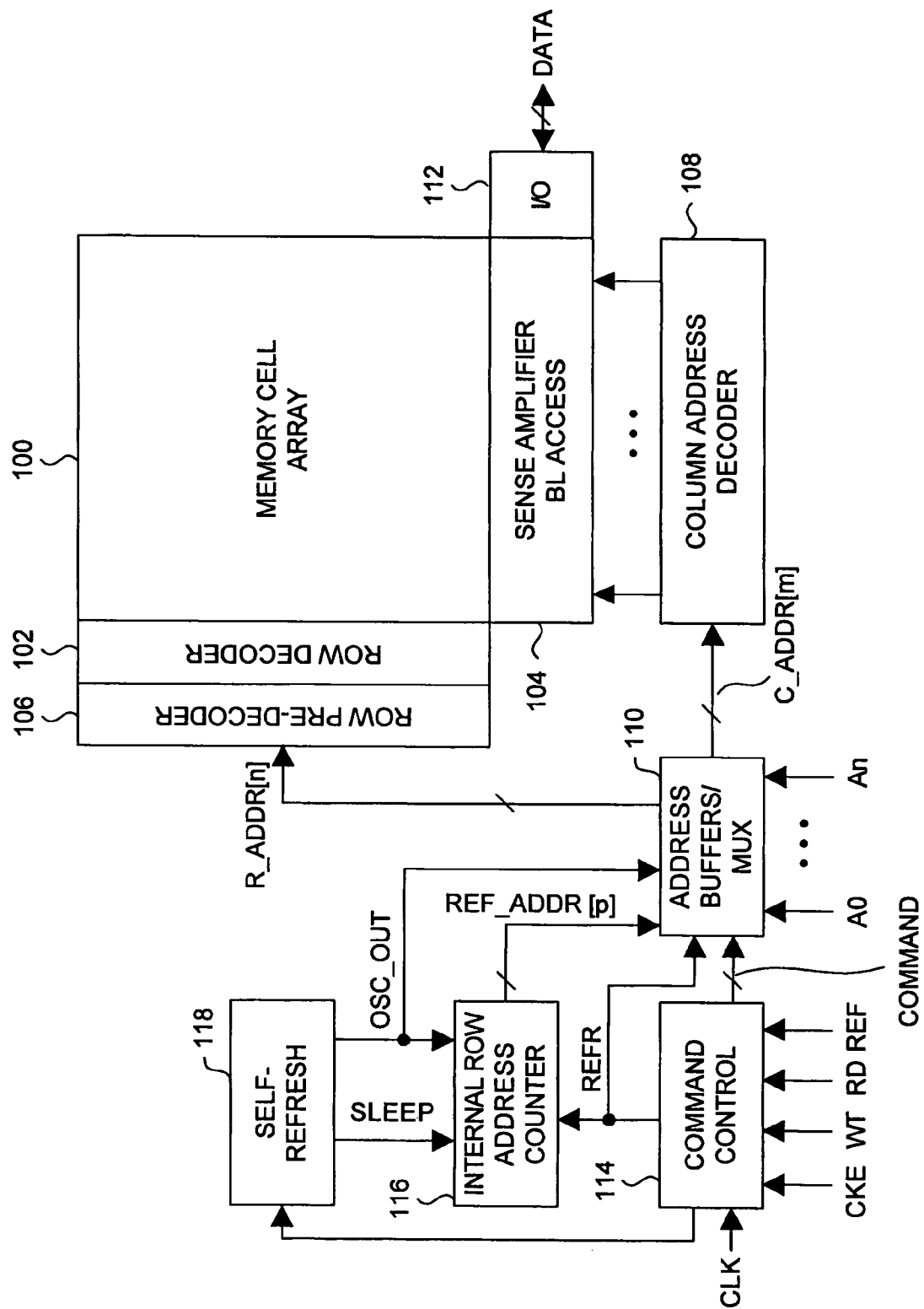
FIG. 1 is a block diagram of a prior art DRAM system.
Figure 2:
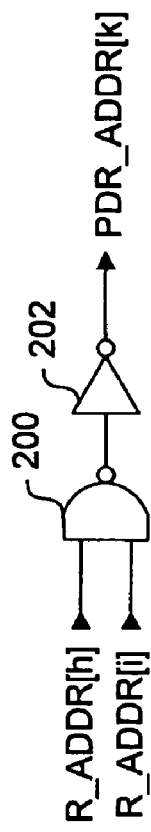
FIG. 2 is a circuit schematic of logic gates.
Figure 3:
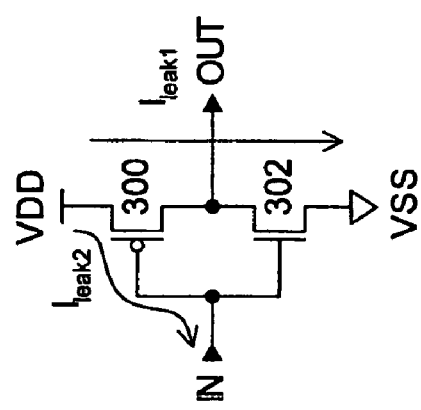
FIG. 3 is a circuit schematic of a CMOS inverter.

The DRAM system includes memory cell array 450, row decoders 452, sense amplifier and bitline access circuits 454, column address decoders 458, data I/O circuits 462 and command controller 464, which perform the same function as memory cell array 100, row decoders 102, sense amplifier and bitline access circuits 104, column address decoders 108, data I/O circuits 112 and command controller 114, respectively, that are previously described for FIG. 1. The command controller 464 responds to clock signal CLK. The row address predecoder 106 is now replaced with selector circuit 400 implemented as a simple multiplexor (MUX) controlled by signal SLEEP, and two logically identical circuits 402 and 404. Other circuits of the DRAM system include a mode-dependent address buffer 406, an internal power switch circuit 408, a self-refresh circuit 410 and an internal row address counter 412. Following is a further discussion of the above-mentioned circuits.

Logic circuit 402 is a high-speed row predecoder circuit while logic circuit 404 is a low power row predecoder circuit. Both circuits are response to the same predetermined logic state input signals. High-speed row predecoder circuit 402 receives fast row address signals R_ADDR_F[n] and provides a predecoded row address to a first input of MUX 400. Low power row predecoder circuit 404 receives slow row address signals R_ADDR_S[n] and provides a predecoded row address to a second input of MUX 400. In a practical implementation, the predecoded row addresses from circuits 402 and 404 are fed to a first set of inputs and second set of inputs of MUX 400 respectively as there would be more than one predecoded address signal provided by each circuit. One set of predecoded row addresses is selectively provided to row decoders 452 by signal SLEEP. Further details of circuits 402 and 404 will be described with reference to FIG. 5A. It is noted that the logical outputs of circuits 402 and 404 are the same for a given REF_ADDR [p]. Collectively, circuits 400, 402 and 404 form a mode-dependent predecoder circuit.

Figure 6:
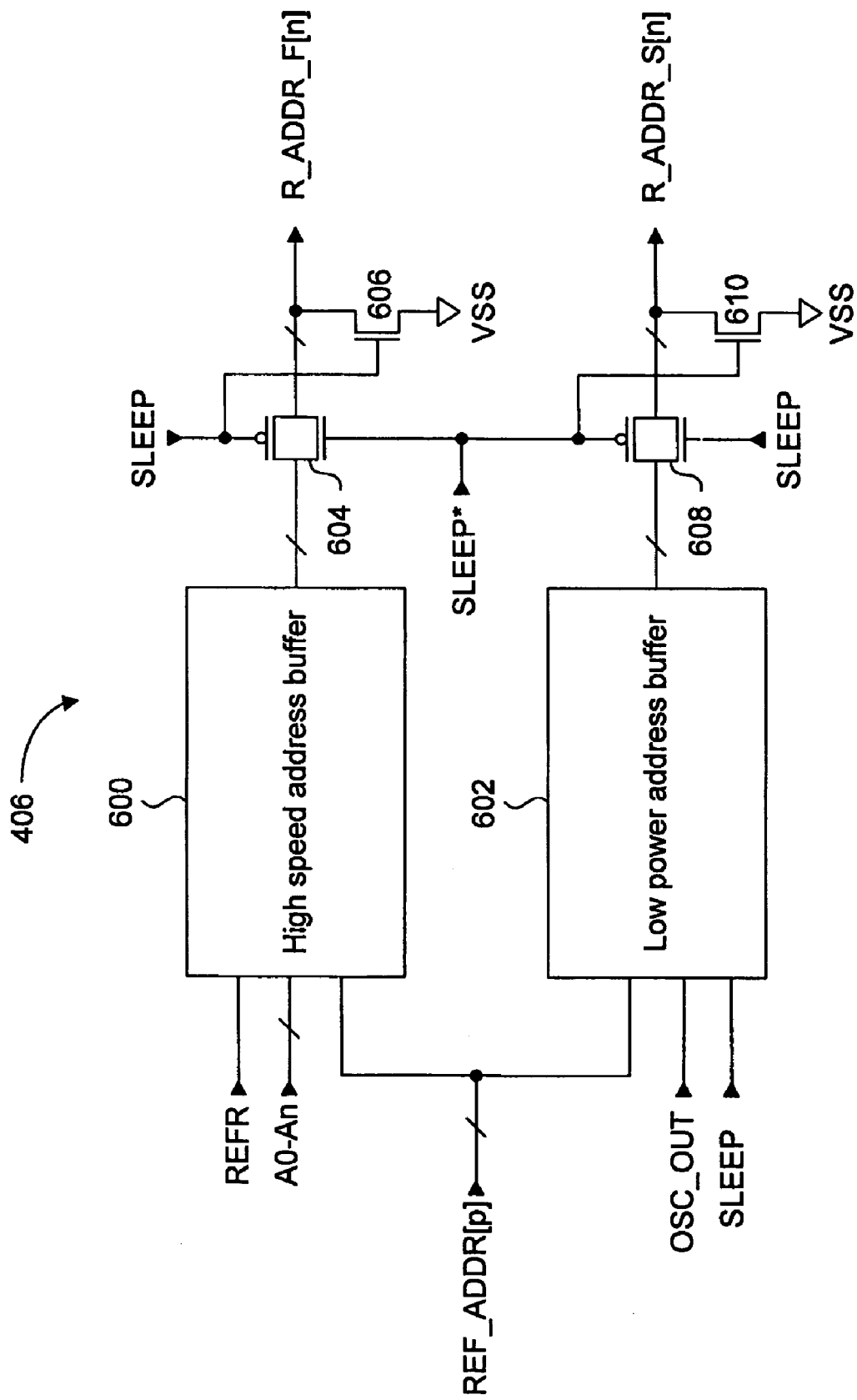
FIG. 6 is a circuit schematic of a mode-dependent row address buffer circuit according to an embodiment of the present invention.

Mode-dependent address buffer 406 selectively provides two independent sets of row addresses, R_ADDR_S[n] and R_ADDR_F[n], in response to signal SLEEP. In the present embodiment, R_ADDR_S[n] and R_ADDR_F[n] would be logically the same for a given refresh address REF_ADDR [p], except for their timing parameters. Accordingly, mode dependent address buffer 406 preferably includes a high speed address buffer for driving R_ADDR F[n], and a low power address buffer for driving R_ADDR S[n]. The high speed address buffer is optimized for high speed and the low power address buffer is optimized for low power consumption. The design parameters of these two address buffers would correspondingly match those of row predecoder circuits 402 and 404. Further details of mode-dependent address buffer 406 are shown in FIG. 6.

Self-refresh circuit 410 functions similarly to circuit 118 in FIG. 1. The control signal SLEEP is generated when the low power sleep mode command is received by command controller 464. The SLEEP control signal is received by MUX 400, mode-dependent address buffer 406, internal power switch 408 and internal row address counter 412.

Internal row address counter 412 is incremented in response to control signal REFR in the normal mode and in response to the oscillation signal OSC_OUT in the self-refresh mode when the SLEEP signal is active, to provide the refresh address signal REF_ADDR[p]. Hence, signal SLEEP selects between OSC_OUT and REFR as the source for generating REF_ADDR[p], Internal power switch 408 is a circuit not used in the system of FIG. 1. This circuit selectively decouples the power supply voltages VDD and VSS from internal power supply rails VDDL, VSSL and VDD_L, VSS_L. These internal rails can be routed to specific circuits within the DRAM system. When decoupled from VDD and VSS, the circuits connected to VDDL and VSSL will no longer have a current path to the power supply, hence reducing/eliminating leakage current. This decoupling can occur in a sleep mode via SLEEP or a deep power down mode via signal DEEP. As will be shown in FIG. 5A, the predecoder circuits 402 and 404 are powered from VDDL and VSSL, but any circuit that is not required during sleep mode can benefit from being connected to VDD_L, VSS_L and VDDL, VSSL. Internal power switch 408 is shown as a central circuit in FIG. 4, but can be implemented in a distributed manner such that the internal rails and switching circuit can be local to a specific circuit.

Figure 5A:
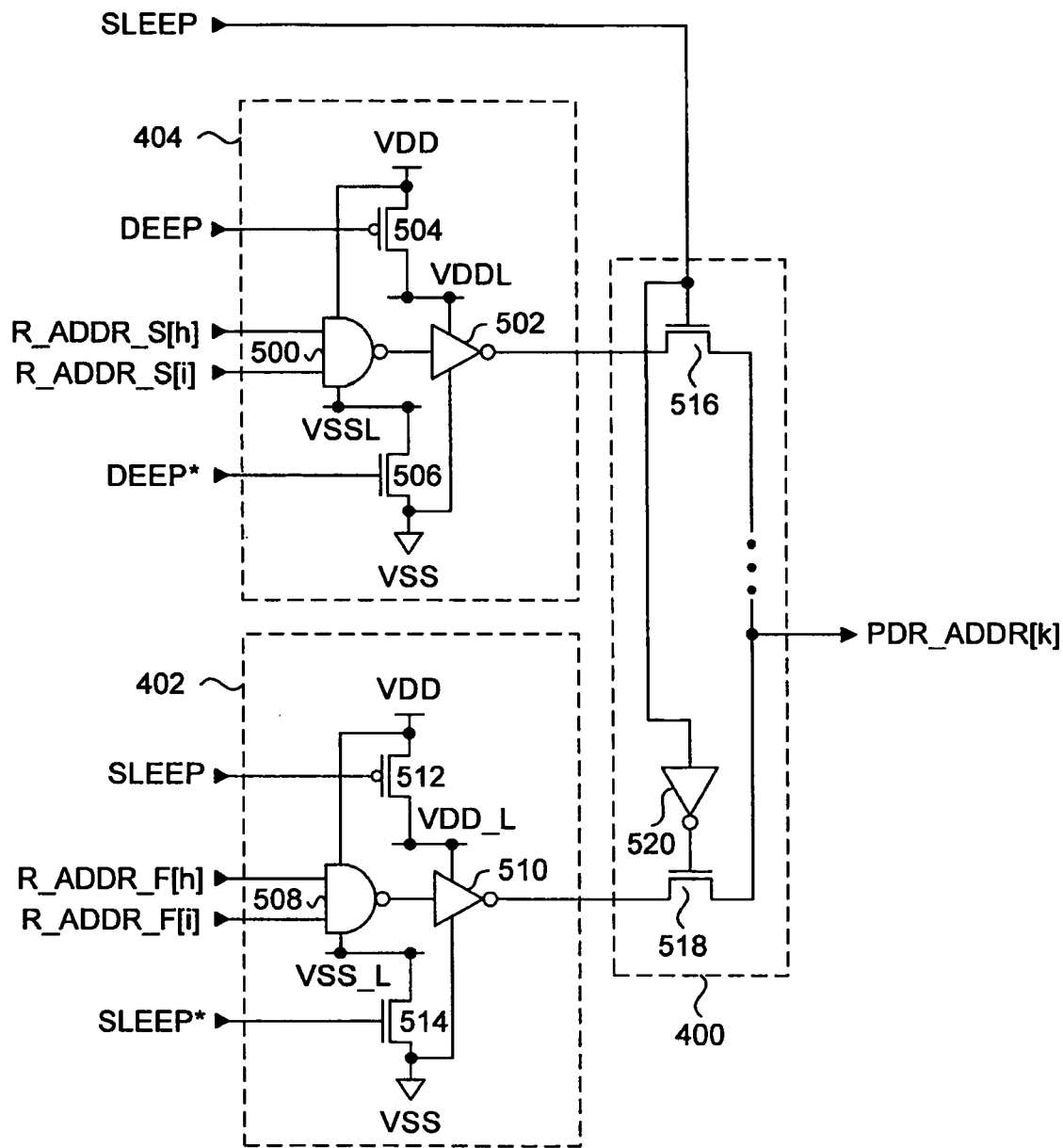
FIG. 5A is a circuit schematic of a mode dependent row predecoder circuit according to an embodiment of the present invention.

FIG. 5A is a circuit schematic showing details of MUX 400, high-speed row predecoder circuit 402, and low power row predecoder circuit 404. Within each predecoder circuit 402 and 404 is decoder logic for generating one predecoded address signal. Each predecoder circuit 402 and 404 will include a plurality of decoder logic gates for generating a respective set of predecoded address signals, but only one is shown in FIG. 5A to simplify the schematic.

The decoder logic of low power row predecoder circuit 404 includes a NAND gate 500 having its output connected to an inverter 502. NAND gate 500 receives row address signals R_ADDR_S[h] and R_ADDR_S[i]. In the present example, the transistors of NAND gate 500 and inverter 502 preferably have a high threshold voltage to resist current leakage. As a result, they operate slower relative to the high speed circuits of predecoder circuit 402. As previously discussed, there are many ways to increase the threshold voltage of a transistor, any of which can be used in the presently disclosed embodiments. In the presently shown example, the internal power switch 408 is distributed amongst the applicable circuit blocks and appears as p-channel transistor 504 and n-channel transistor 506. P-channel transistor 504 decouples VDD from internal power line VDDL in response to signal DEEP, while n-channel transistor 506 decouples VSS from internal power line VSSL in response to the complement signal of DEEP, labelled DEEP*. Signal DEEP is driven to a logic high level to turn off transistors 504 and 506 when the DRAM system enters a deep power down mode to maximize power conservation across the entire system. During a deep power down mode, the data stored in the memory cells can be lost, hence self-refreshing memory cells is not required.

The decoder logic of high-speed row predecoder circuit 402 includes a NAND gate 508 having its output connected to an inverter 510. NAND gate 508 receives row address signals R_ADDR_F[h] and R_ADDR_F[i]. In the present example, the transistors of NAND gate 508 and inverter 510 preferably have a low threshold voltage (Vt) to maximize speed. Unfortunately for nanometer scale transistors with low Vt, static current leakage is a significant portion of overall power consumption. Predecoder circuit 402 includes the distributed internal power switch circuit consisting of p-channel transistor 512 and n-channel transistor 514 coupling VDD and VSS to VDD_L and VSS_L respectively. The gate terminal of transistors 512 and 514 receive control signal SLEEP and its complement SLEEP* respectively, for decoupling the internal rails VDD_L and VSS_L from VDD and VSS in the sleep mode.

Figure 5B:
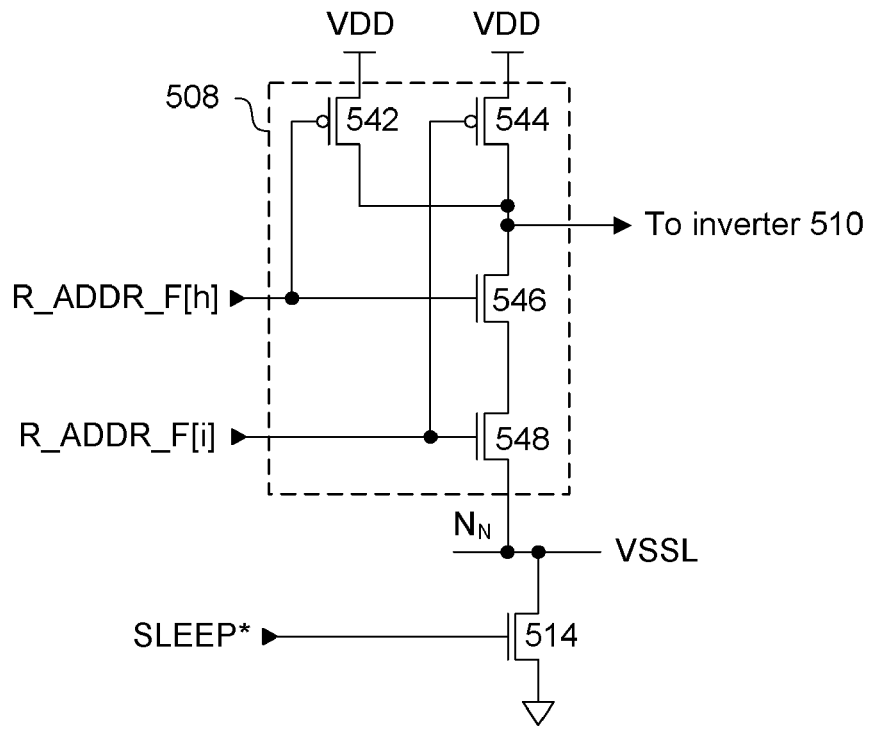
FIG. 5B is a circuit schematic of a NAND gate included in the high-speed row predecoder circuit shown in FIG. 5A.

The NAND gate 500 of low power row predecoder circuit 404 and NAND gate 508 of high-speed row predecoder circuit 402 have the same circuit structure. FIG. 5B shows only NAND gate 508 having a known circuit configuration having p-channel transistors 542 and 544 and n-channel transistors 546 and 548. The source of transistor 548 is connected to the drain of transistor 514, the gate of which receives control complement signal SLEEP*. Row address signals R_ADDR_F[h] and R_ADDR_F[i] are fed to the gates of transistors 542, 544, 546 and 548. The NAND output signal is provided from the coupled drains of transistors 544 and 546 to the input of inverter 510. VSS_L is a voltage level at node $N_N$ between the source of transistor 548 and the drain of transistor 514. The circuit configuration of NAND gate 508 is similar to that of NAND gate 500, but is coupled to VDD_L.

Figure 5C:
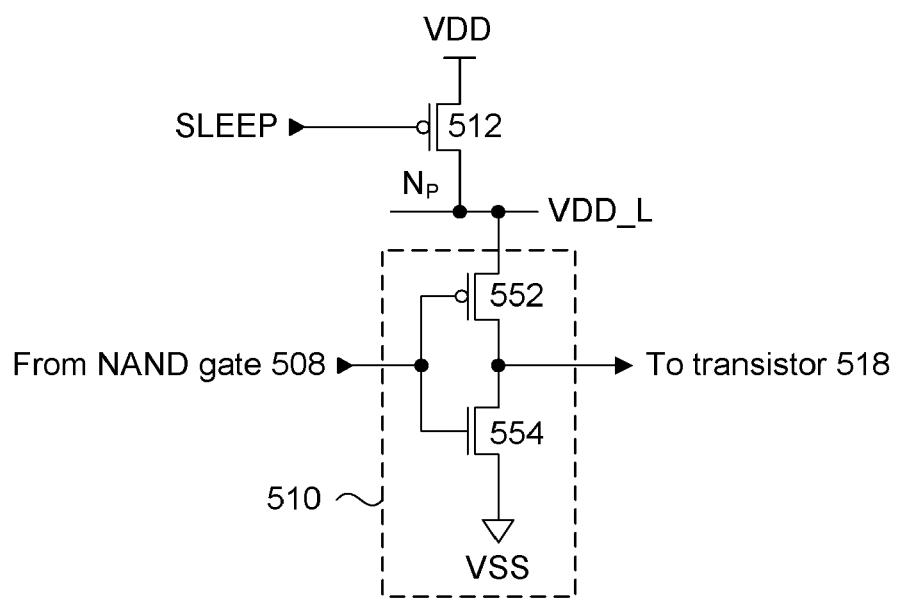
FIG. 5C is a circuit schematic of an inverter included in the high-speed row predecoder circuit shown in FIG. 5A.

The inverter 502 of low power row predecoder circuit 404 and the inverter 510 of high-speed row predecoder circuit 402 have the same circuit structure. FIG. 5C shows the circuit configuration of inverter 510. Referring to FIG. 5C, inverter 510 includes drain coupled p-and n-channel transistors 552 and 554 that are connected in series with transistor 512, the gate of which receives SLEEP. The output signal from NAND gate 508 of row predecoder circuit 402 is fed to the gates of transistors 552 and 554. The inverted output signal of inverter 510 is provided to transistor 518 of MUX 400. VDD_L is a voltage level at node $N_p$ between the drain of transistor 512 and the source of transistor 552. The circuit configuration of inverter 502 is similar to that of inverter 510, but is coupled to VDDL.

It should be noted that control signal SLEEP can include a logical OR'ing of SLEEP with DEEP. Hence, SLEEP is driven to the logic high level when DEEP is driven to the logic high level to isolate both predecoder circuits 402 and 404 from the power supplies.

MUX 400 is shown as including simple n-channel pass transistors 516 and 518 having source/drain input terminals connected to the output of inverters 502 and 510 respectively. The gate terminal of transistor 516 receives control signal SLEEP and the gate terminal of transistor 518 receives an inverted SLEEP signal through inverter 520. A person skilled in the art will understand that n-channel pass transistors 516 and 518 can be replaced with full CMOS transmission gates or p-channel transistors. Furthermore, only a single pairing of transistors 516 and 518 is shown, but it should be understood that in practice, there will be a pair of pass transistors configured in the same way for each pair of decoder logic gates.

During a sleep mode when SLEEP is driven to the active logic high level, transistors 512 and 514 are turned off to isolate the high-speed row predecoder circuit decoder logic from the power supplies. Current leakage through this circuit is minimized since transistors 512 and 514 can be formed as high threshold voltage devices that exhibit minimal current leakage. With SLEEP at the logic high level, transistor 518 is turned off while transistor 516 is turned on. The low power row predecoder circuit 404 remains active and passes its output to PDR_ADDR[k].

SLEEP is driven to the inactive logic low level to turn on transistors 512 and 514. Transistor 518 is turned on while transistor 516 is turned off. If desired, DEEP can be logically OR'd with SLEEP* and driven to VDD to decouple VDDL and VSSL of low power row predecoder circuit 404 from VDD and VSS when SLEEP is at the inactive logic low level.

FIG. 6 is a circuit schematic of mode-dependent address buffer 406 shown in FIG. 4. Mode-dependent address buffer 406 includes high speed address buffer 600 and low power address buffer 602, both receiving and operable for latching refresh address REF_ADDR[p] from row address counter 412. High speed address buffer 600 can be set to receive and latch external address signals A0-An instead of REF_ADDR[p] in response to control signal REFR. Although not shown, high speed address buffer 600 can include a MUX circuit for passing one of A0-An or REF_ADDR[p]. Also, mode-dependent address buffer 406 performs functions in response to the other command signals COMMAND (see FIG. 4). Low power address buffer 602 receives SLEEP for latching REF_ADDR[p] and passing OSC_OUT during self-refresh operations. The output of high speed address buffer 600 is coupled to R_ADDR_F[n] by CMOS transmission gate 604 controlled by SLEEP and SLEEP*. R_ADDR_F[n] is coupled to VSS by n-channel transistor 606 which has its gate connected to SLEEP. Similarly, the output of low power address buffer 602 is coupled to R_ADDR_S[n] by CMOS transmission gate 608 controlled by SLEEP* and SLEEP. R_ADDR_S[n] is coupled to VSS by n-channel transistor 610 which has its gate connected to SLEEP*.

In normal operation, SLEEP is at the inactive logic low level and SLEEP* is at the high logic level to turn on CMOS transmission gate 604 and to turn off transistor 606. Hence R_ADDR_F[n] is driven by high speed address buffer 600. Conversely, CMOS transmission gate 608 is turned off and transistor 610 is turned on to hold R_ADDR_S[n] at VSS.

In the sleep mode, SLEEP is set to the active high logic level and SLEEP* is at the low logic level to turn off CMOS transmission gate 604 and to turn on transistor 606. Hence R_ADDR_F[n] is held at VSS. Conversely, CMOS transmission gate 608 is turned on and transistor 610 is turned off to allow low power address buffer 602 to drive R_ADDR_S[n].

The high speed address buffer 600 can be configured to include the distributed internal power switch with internal VDD_L and VSS_L lines that can be decoupled from VDD and VSS to reduce power consumption while the circuit is not being used in the sleep mode. Furthermore, the low power address buffer 602 can include the distributed internal power switch circuits with VDDL and VSSL rails.

In the presently shown example of FIG. 6, R_ADDR_F[n] and R_ADDR_S[n] are driven to VSS when disconnected from their respective buffer circuits. Alternately, R_ADDR_F[n] and R_ADDR_S[n] can be driven to VDD, or simply left to float. An advantage of driving R_ADDR_F[n] and R_ADDR_S[n] to VSS or VDD will be made apparent later.

Figure 7:
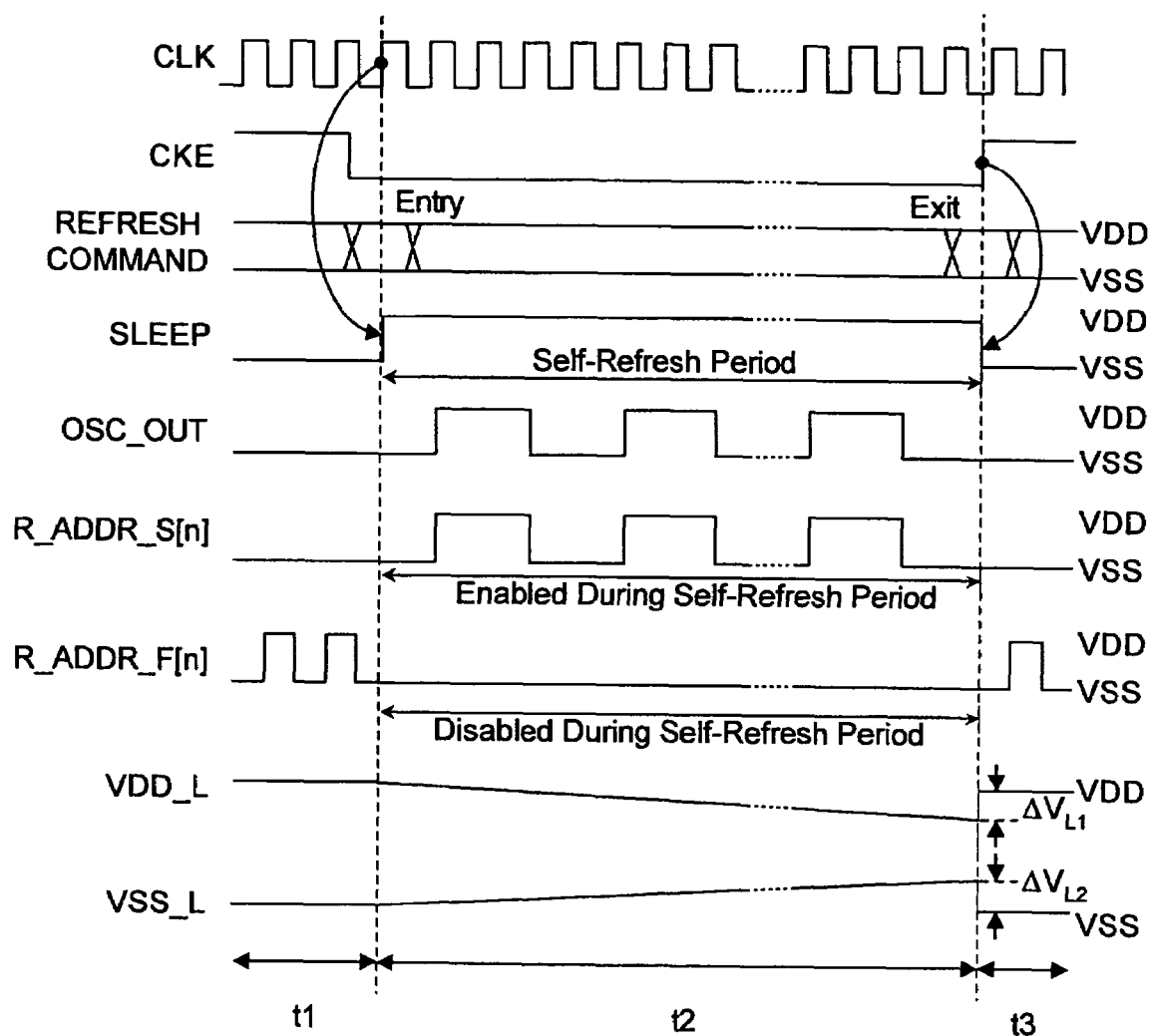
FIG. 7 is a timing diagram illustrating the operation of a low power self-refresh operation according to an embodiment of the present invention.

Following is a description of the operation of the DRAM system shown in FIG. 4 together with FIGS. 5A, 5B, 5C and 6, with reference to the timing/sequence diagram shown in FIG. 7. The diagram of FIG. 7 shows the signal traces for the following: clock signal CLK; clock enable signal CKE; external refresh command REFRESH; control signal SLEEP; oscillation signal OSC_OUT, slow row address R_ADDR_S[n]; fast row address R_ADDR_F[n]; and the internal rails VDD_L and VSS_L used within high-speed row predecoder circuit 402.

Normal operations, which include read/write and auto-refresh, occur during time period t1. Because control signal SLEEP is held at the inactive VSS level, OSC_OUT is held at the inactive VSS level. With SLEEP at the inactive level, the high speed address buffer 600 provides R_ADDR_F[n] signals at high frequency to the high-speed row predecoder circuit 402, which then generates a predecoded row address passed on by MUX 400. During this time period, R_ADDR_S[n] is held at VSS. Since the high-speed row predecoder circuit 402 is fully active, VDD_L and VSS_L are respectively coupled to VDD and VSS.

Near the end of time period t1, CKE drops to VSS and a valid refresh command REFRESH COMMAND is received at the beginning of time period t2. Under these conditions, SLEEP is driven to the active logic high level of VDD to initiate the sleep mode. With SLEEP at the active level of VDD, OSC_OUT will oscillate at a relaxed frequency to trigger the row address counter 412 to provide a new refresh address REF_ADDR[p] synchronously with OSC_OUT. The low power address buffer 602 will latch REF_ADDR[p] and drive R_ADDR S[n] at the OSC_OUT frequency. MUX 400 will pass only the predecoded row address provided by low power row predecoder circuit 404, while VDD_L and VSS_L in high-speed row predecoder circuit 402 are disconnected from VDD and VSS respectively. As shown in FIG. 7, VDD_L slowly discharges and VSS_L slowly charges. An eventual offset voltage $\Delta V_{L1}$ of VDD_L at the end of the sleep mode is given by:

$$\Delta V_{L1} = V_{TP0} - V_{TP1} + (S/\ln 10)[\ln(W_{P1}/W_{P0})] \qquad (1)$$

where:

$V_{TP0}$ is the threshold voltage of transistor 512;

$V_{TP1}$ is the threshold voltage of p-channel transistor 552 of inverter 510;

$W_{P0}$ is the channel width of transistor 512;

$W_{P1}$ is the channel width of transistor 552; and

S is the subthreshold swing.

Similarly, an eventual offset voltage $\Delta V_{L2}$ of VSS_L at the end of the sleep mode is given by:

$$\Delta V_{L2}=|V_{TN0}|-|V_{TN1}|+(S/\ln 10)[\ln(W_{N1}/W_{N0})] \quad (2)$$

where:

$V_{TN0}$ is the threshold voltage of the transistor 514;

$V_{TN1}$ is the threshold voltage of the n-channel transistor 548 of NAND gate 508;

$W_{N0}$ is the channel width of the transistor 514;

$W_{N1}$ is the channel width of transistor 548; and

S is the subthreshold swing.

However, since neither VDD_L nor VSS_L is connected to the VDD and VSS power supply, current leakage is minimized.

The self-refresh period t2 will continue until CKE rises to VDD at the beginning of time period t3. SLEEP is driven to the inactive VSS level and OSC_OUT falls to the inactive VSS level. With SLEEP at the inactive VSS level, the low power address buffer 602 is disabled, and the high speed address buffer is enabled to drive R_ADDR_F[n] for the enabled high-speed row predecoder circuit 402. As shown in FIG. 7, the internal VDD_L and VSS_L lines are restored to VDD and VSS after the internal power switch re-connects them to VDD and VSS.

As previously mentioned, there is an advantage to having two independent sets of row addresses, namely R_ADDR_F[n] and R_ADDRSl[n]. According to an embodiment of the present invention, the signal carrying lines of R_ADDR_F[n] can be interleaved with those of R_ADDR_S[n] to provide noise shielding and cross talk reduction. This type of shielding is beneficial for high frequency signaling, such as for row addresses R_ADDR_F[n]. It is well known in the prior art that signal lines can be shielded by laying them adjacent to VDD or VSS lines. According to the present embodiments, the signal lines can be interleaved vertically or horizontally.

Figures 8, 9:
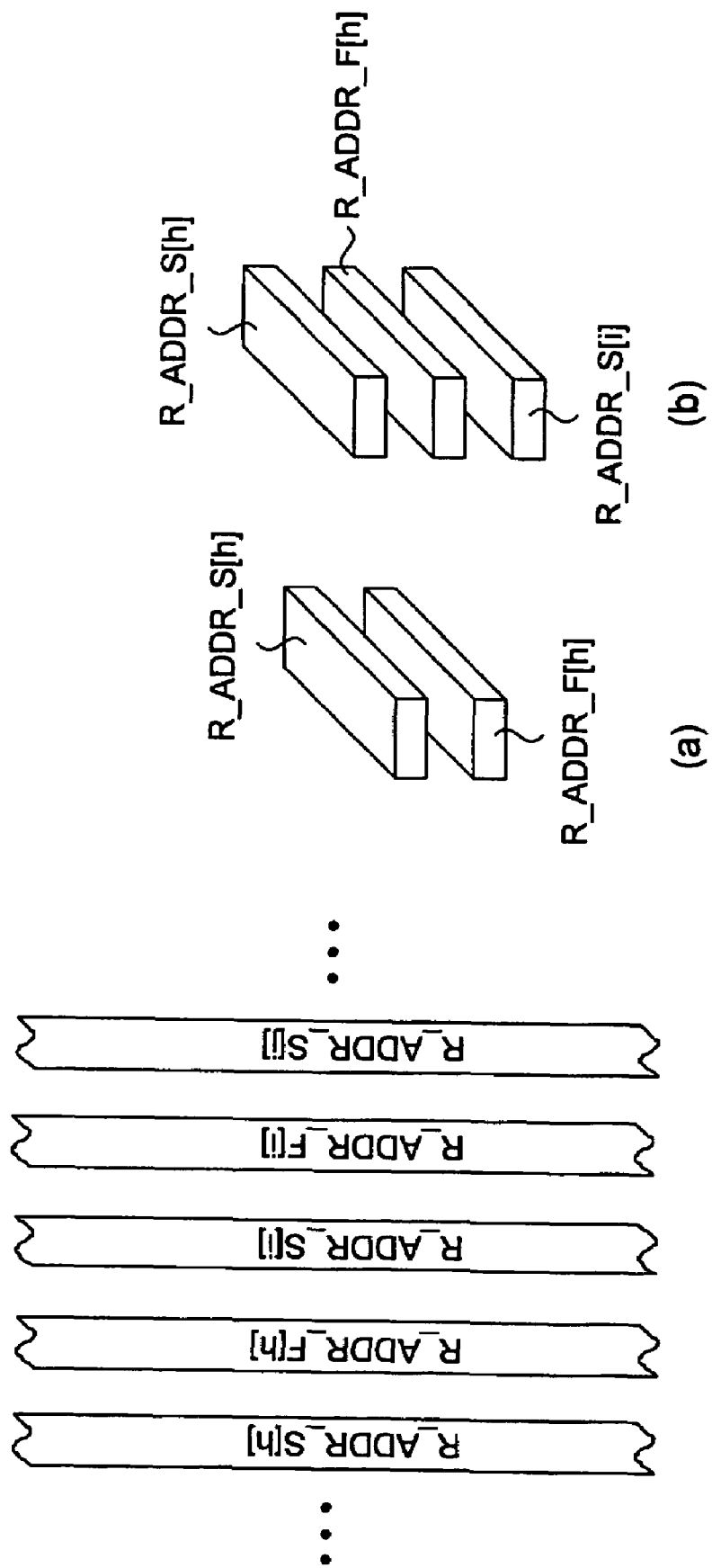
FIG. 8 is a planar layout of interleaved row address lines.
FIG. 9 is an isometric view of vertically interleaved row address lines.

FIG. 8 illustrates a horizontal interleaving layout of the R_ADDR_F[n] and R_ADDR_S[n] signal lines. These lines are typically formed of metal and on the same metal layer of the semiconductor device. As shown in FIG. 8, each line of R_ADDR_F[n] is interleaved with each line of R_ADDR_S[n]. In FIG. 8, an additional R_ADDR_S[j] line is shown. It is noted that variable j is equal to 0 or an integer value greater than 0. Referring to FIG. 6, all the individual signal lines of R_ADDR_S[n] are driven to VDD in the normal mode, thus shielding each R_ADDR_F[n] signal line.

FIG. 9 illustrates a vertical interleaving layout of the R_ADDR_F[n] and R_ADDR_S[n] signal lines. Example (a) shows two metal lines vertically stacked with respect to each other, where the top line carries a R_ADDR_S[n] address signal and the bottom line carries a R_ADDR_F[n] address signal. Example (b) shows a configuration consisting of three metal lines vertically stacked with respect to each other. The top and bottom lines carry R_ADDR_S[n] address signals and the middle line carries a R_ADDR_F[n] address signal. Each metal line in examples (a) and (b) are formed with a different metal layer. The vertical address line interleaving configuration can be combined with horizontal interleaving.

In summary, by implementing duplicate, low power versions of high speed logic circuits in the system, significant power savings can be realized. For DRAM systems, the present invention is embodied by the low power address buffer and the low power row predecoder circuit. The previously described embodiments of the invention should not be limited to the addition of a low power logic circuit in parallel to a high speed logic circuit. For example, in addition to a low power logic circuit, the system can include a third logic circuit optimized to balance power consumption and speed. In the embodiments, elements, devices and circuits are connected to each other as shown in the figures, for the sake of simplicity. In practical applications of the present invention, devices, elements and circuits may be connected or coupled directly to each other or may be connected or coupled indirectly to each other through other devices, elements, circuits.

The present invention can be applied to any hierarchical level of address decoding, and other power supplies such as VPP or VBB can be controlled.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A mode dependent logic circuit for use in a dynamic random access memory, comprising:
   a first circuit for generating a first address in a normal operating mode;
   a second circuit logically identical to the first circuit for generating a second address logically identical to the first address in a sleep operating mode, the second circuit consuming less power than the first circuit, and
   a selector for receiving the first address and the second address, the selector passing the first address in the normal operating mode and passing the second address in the sleep operating mode.

2. The mode dependent logic circuit of claim 1, wherein the second circuit includes transistors having a higher threshold voltage than transistors of the first circuit.

3. The mode dependent logic circuit of claim 1, wherein the first circuit includes a first power switch circuit for selectively disconnecting the transistors of the first circuit from VDD or VSS in the sleep operating mode.

4. The mode dependent logic circuit of claim 3, wherein the second circuit includes a second power switch circuit for selectively disconnecting the transistors of the second circuit from VDD and VSS in a deep power down operating mode.

5. The mode dependent logic circuit of claim 1, further including at least two first signal lines for providing the first input signal, and at least two second signal lines for providing the second input signal, the first and the second signal lines being interleaved with each other.

6. The mode dependent logic circuit of claim 5, further including a first drive circuit coupled to the at least two first signal lines, and a second drive circuit coupled to the at least two second signal lines, the second drive circuit driving the at least two second signal lines to one of VDD and VSS in the first operating mode.

7. The mode dependent logic circuit of claim 4, wherein the first power switch circuit disconnects the transistors of the first circuit from VDD or VSS in the deep power down operating mode.

8. The mode dependent logic circuit of claim 7, wherein the second power switch circuit receives a deep sleep signal at an active logic level for selectively disconnecting the transistors of the second circuit from VDD or VSS in the deep power down operating mode, the deep sleep signal being at an inactive logic level in the sleep operating mode.

9. The mode dependent logic circuit of claim 8, wherein the first power switch circuit receives a sleep signal at an active logic level for selectively disconnecting the transistors of the first circuit from VDD or VSS, the sleep signal being at the active logic level when at least one of the deep sleep signal and a sleep mode signal are at the active logic level.

* * * * *